United States Patent
GanapathiSubramanian et al.

(10) Patent No.: US 7,307,697 B2
(45) Date of Patent: Dec. 11, 2007

(54) ADAPTIVE SHAPE SUBSTRATE SUPPORT SYSTEM

(75) Inventors: Mahadevan GanapathiSubramanian, Austin, TX (US); Sidlgata V. Sreenivasan, Austin, TX (US)

(73) Assignee: Board of Regents, The University of Texas System, Austin, TX (US)

(*) Notice: Subject to any disclaimer, the term of this patent is extended or adjusted under 35 U.S.C. 154(b) by 296 days.

(21) Appl. No.: 11/136,891

(22) Filed: May 25, 2005

(65) Prior Publication Data

US 2005/0264134 A1    Dec. 1, 2005

Related U.S. Application Data

(60) Provisional application No. 60/575,791, filed on May 28, 2004.

(51) Int. Cl.
    G03B 27/60    (2006.01)
    G03B 27/42    (2006.01)
    G03B 27/58    (2006.01)

(52) U.S. Cl. .............. 355/73; 355/53; 355/72; 269/21

(58) Field of Classification Search .............. 355/53, 355/72, 75; 310/311; 269/21
    See application file for complete search history.

(56) References Cited

U.S. PATENT DOCUMENTS

| | | | | |
|---|---|---|---|---|
| 5,923,408 | A * | 7/1999 | Takabayashi | 355/53 |
| 6,182,510 | B1 * | 2/2001 | Stanke et al. | 73/597 |
| 6,305,677 | B1 * | 10/2001 | Lenz | 269/13 |
| 6,313,567 | B1 * | 11/2001 | Maltabes et al. | 310/328 |
| 6,696,220 | B2 | 2/2004 | Bailey et al. | |

* cited by examiner

*Primary Examiner*—Alan Mathews
(74) *Attorney, Agent, or Firm*—Kelly K. Kordzik; Fish & Richardson P.C.

(57) ABSTRACT

The present method and system features an active compliant pin chuck to hold a substrate, having opposed first and second surfaces, and compensates for non-planarity in one of the surfaces of the substrate. To that end, the support system includes a chuck having a plurality of piezo pins and reference pins, with the piezo pins being coupled to piezo actuators to undergo relative movement with respect to said reference pins. These and other embodiments are discussed more fully below.

5 Claims, 3 Drawing Sheets

US 7,307,697 B2

ADAPTIVE SHAPE SUBSTRATE SUPPORT SYSTEM

CROSS-REFERENCE TO RELATED APPLICATIONS

The present patent application claims priority to U.S. provisional patent application No. 60/575,791 entitled ADAPTIVE SHAPE SUBSTRATE CHUCK, filed May 28, 2004 and having Mahadevan GanapathiSubramanian and Sidlgata V. Sreenivasan listed as inventors and is a divisional patent application of U.S. application Ser. No. 11/136,892 filed herewith with attorney docket number PA225N222V145, entitled ADAPTIVE SHAPE SUBSTRATE SUPPORT METHOD having Mahadevan GanapathiSubramanian and Sidlgata V. Sreenivasan listed as inventors.

BACKGROUND OF THE INVENTION

The field of invention relates generally to supports for substrates. More particularly, the present invention is directed to a chuck suited for use in imprint lithography.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication have been employed include biotechnology, optical technology, mechanical systems and the like. Many of the micro-fabrication techniques involve various processes, including deposition, such as chemical vapor deposition, physical vapor deposition, atomic layer deposition and the like, as well as wet and/or dry etching techniques to pattern substrates.

In addition to the standard micro-fabrication techniques, there exists a relatively new and efficient patterning technique referred to as imprint lithography. An exemplary imprint lithography is described in detail in numerous publications, such as U.S. Pat No. 6,873,087 entitled HIGH PRECISION ORIENTATION ALIGNMENT AND GAP CONTROL STAGES FOR IMPRINT LITHOGRAPHY PROCESSES; U.S. Pat. No. 6,842,226, entitled IMPRINT LITHOGRAPHY TEMPLATE COMPRISING ALIGNMENT MARKS; U.S. Pat. No. 6,696,220 entitled TEMPLATE FOR ROOM TEMPERATURE, LOW PRESSURE MICRO-AND NANO-IMPRINT LITHOGRAPHY; and U.S. Pat. No. 6,719,915 entitled STEP AND FLASH IMPRINT LITHOGRAPHY, all of which are assigned to the assignee of the present invention. The fundamental imprint lithography technique as shown in each of the aforementioned published patent applications includes formatting a relief pattern in a polymerizable layer and transferring the relief pattern into an underlying substrate to form a relief image in the substrate. To that end, a template is employed spaced-apart from the substrate with a formable liquid present between the template and the substrate. The liquid is solidified forming a solidified layer that has a pattern recorded therein that is conforming to a shape of the surface of the template in contact with the liquid. The substrate and the solidified layer are then subjected to processes to transfer into the substrate a relief image that corresponds to the pattern in the solidified layer.

As a result of the aforementioned micro-fabrication techniques, the demand to ensure the flatness/planarity of substrates being processed/patterned has increased. Typically, it is desired that the substrate flatness be greater than the depth of focus requirements of the process for typical photolithographic patterning techniques. The depth of focus is determined by the wavelength of light, numerical aperture of lenses and other considerations of the lithography equipment, as well as the post imaging processes. As a result, it is often desired that the substrate flatness be such that the variation in height of the region being patterned be no greater than 200 nm. This has proved challenging, because substrates having a planarization layer disposed thereon demonstrate height variations over an area of the planarization layer being processed that is on the order of microns.

Most prior art chucking systems attempt to abrogate the non-planarity of substrates employing vacuum and/or electrostatic forces. Although this reduces the warp and bow in the substrate over the entire area of the same, these systems often are unable to attenuate local height variations. In addition, the presence of back-side particles exacerbates non-planarity problems of substrate.

There is a need, therefore, to provide improved support systems for substrates.

SUMMARY OF THE INVENTION

The present system features an active compliant pin chuck to hold a substrate, having opposed first and second surfaces, and compensates for non-planarity in one of the surfaces of the substrate. To that end, the support system includes a chuck having a plurality of piezo pins and reference pins, with the piezo pins being coupled to piezo actuators to undergo relative movement with respect to said reference pins. These and other embodiments are discussed more fully below.

DETAILED DESCRIPTION OF THE INVENTION

Figure 1:
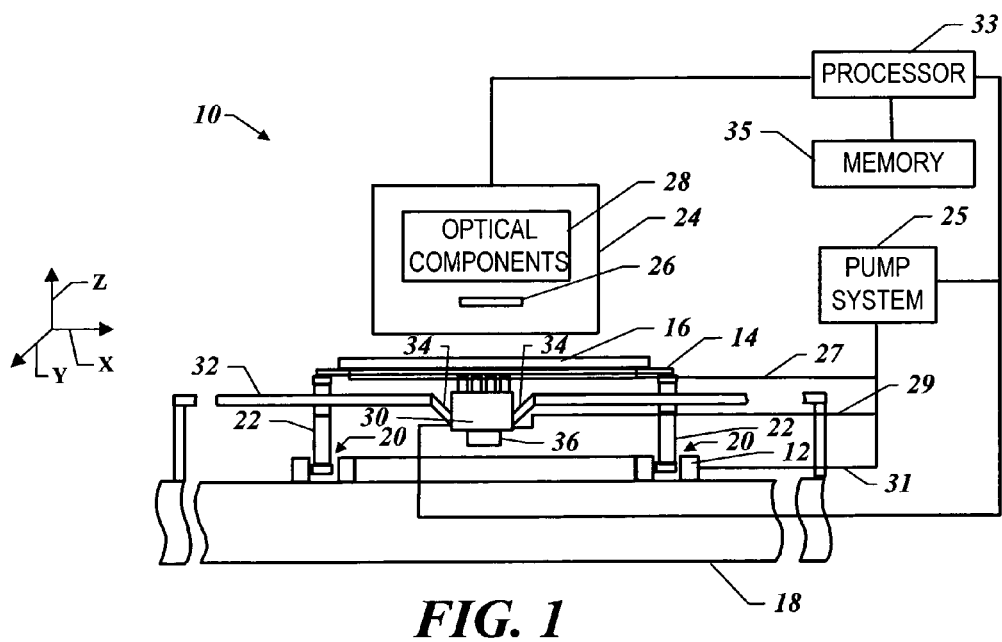
FIG. 1 is a simplified plan view of a patterning system in accordance with the present invention.

FIG. 1 depicts a lithographic system 10 in accordance with one embodiment of the present invention that includes a stage 12 having a support 14. A substrate 16 is disposed upon support 14. Support 14 is moveably coupled with respect to a stage 18 through known mechanisms, which, in the present example, are vacuum preloaded air bearings 20.

Specifically, stanchions 22 extend from support 14 toward stage 18 with air bearings 20 being coupled between stanchions 22 and stage 18.

Disposed opposite to support 14 is a pattern generation system 24. Pattern generation system 24 may be any known in the art, including a photolithographic tool typically referred to as a stepper, such as the MA300Plus available from Suss Microtec of Munich Germany, or an imprint lithographic tool, such as the Imprio™ 100 sold by Molecular Imprints, Inc. of Austin, Tex. Image generation system 24 includes a device 26 having an original pattern formed therein that is the basis of the pattern to be formed on substrate 12, as well as, a source of actinic energy and optical subsystems required to pass the actinic energy through device 26 and impinge upon substrate 16, shown generally as optical components 28. In a photolithography system, device 26 is typically referred to as being a mask. In an imprint lithography system, device 26 is a patterned region of a template, typically referred to as a mold.

Disposed opposite to device 26 is an active pin chuck 30 that is coupled to a platform 32 via flexures 34. Movement of chuck 30 along a Z-direction is facilitated by vacuum loaded air bearing 36, which operates to vary a distance between chuck 30 and stage 18. Air bearings 20 facilitate bi-directional movement along each of two orthogonal directions, e.g., along the X and Y directions. To that end, air bearings 20 operate to selectively allow or prevent relative movement between stanchions 22 and stage 18, as well as translational motion between support 14 and stage 18. Specifically, when facilitating movement between stage 18 and stanchions 22, air bearings increase a distance between chuck 30 so that support 14 is spaced apart therefrom. Upon application of a vacuum to air bearings 20, stanchions are affixed to stage 18 with support 20 resting against chuck 30. It should be understood, however, that a z-actuator with a range of motion of 20 micro meters may also be used instead of air bearings 20. To facilitate operation of air bearings 20 and chuck 30, a pump system 25 may be in fluid communication with support 14, chuck 30, including air bearing 36, and air bearings 20 over lines 27, 29 and 31, respectively. Control of system 10 is achieved by a processor 33 in data communication with various components thereof, such as stage 18, air bearings 20, stanchions 22, image generation system 24, pump system 25 and chuck 30. To that end, processor 33 is in data communication with a memory 35 storing control software that includes computer readable code.

Figure 2:
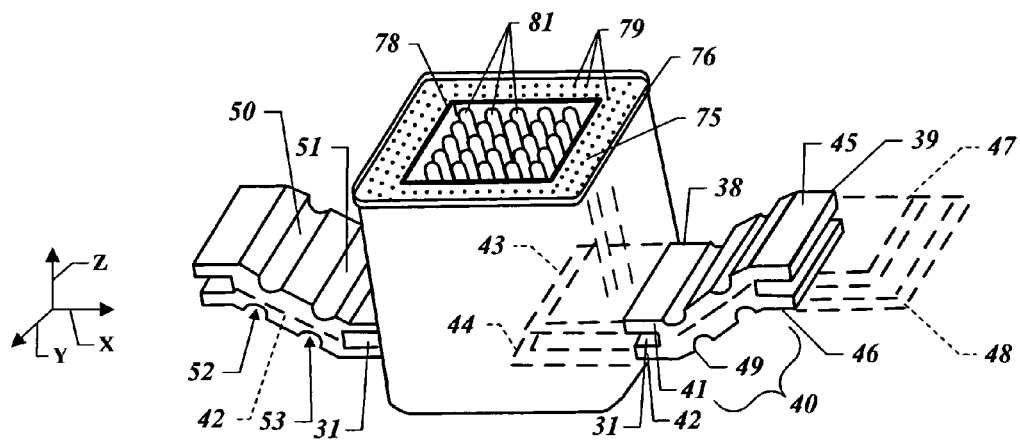
FIG. 2 is a perspective view of a chuck and flexures, shown in FIG. 1, in accordance with the present invention.
Figure 3:
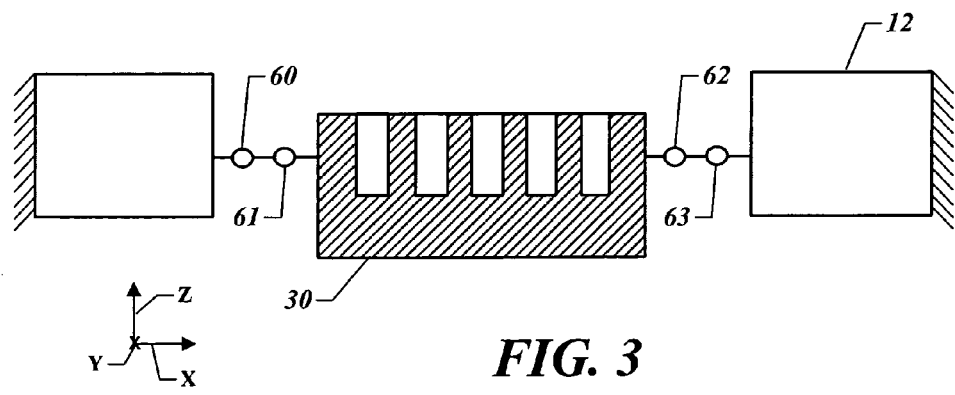
FIG. 3 is a mechanical schematic of the chuck, flexures and platform, shown in FIG. 1, in accordance with the present invention.
Figure 4:
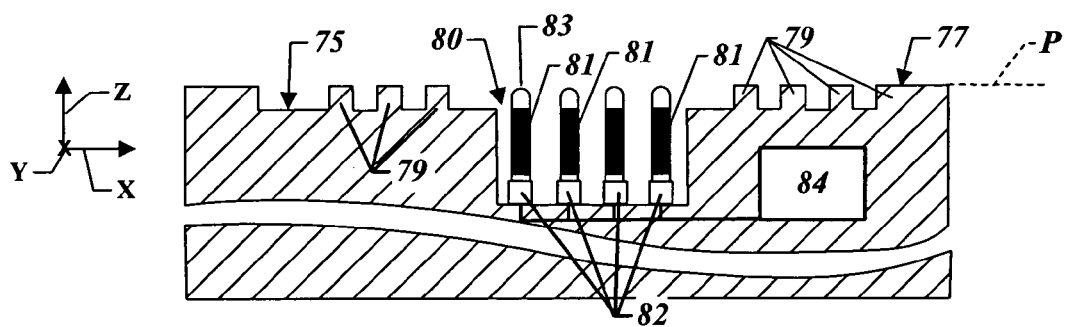
FIG. 4 is a detailed plan view of a substrate support system, shown in FIG. 1, including an active pin chuck in accordance with the present invention.

Referring to FIGS. 1 and 2, flexures 34 are configured to define a four-bar linkage system with flexures 34 comprising two bars of the linkage, chuck 30 comprising one bar of the linkage and platform 32 comprising the final bar of the four-bar linkage. The four-bar linkage minimizes movement of chuck 30 along the X and Y directions when the same undergoes movement along the Z direction. To that end, flexures 34 are fabricated from a body of aluminum, stainless steel or any other suitable material that minimizes particulate contamination. The body is configured to include two spaced-apart coupling portions 38 and 39 and a flexing portion 40 extending therebetween. Coupling portions 38 are attached to a detent 31 of chuck 30 using any suitable means, such as threaded fasteners not shown. Coupling portions 39 are attached to platform 32 using any suitable means, such as threaded fasteners not shown.

Coupling portion 38 includes two spaced-apart projections 41 and 42, each of which extends in a plane 43 and 44, respectively, with plane 43 being spaced-apart from and extending parallel to plane 44. Coupling portion 39 includes two spaced-apart projections 45 and 46, each of which extends in a plane 47 and 48, respectively, with plane 47 being spaced-apart from and extending parallel to plane 48. Flexing portion 40 extends along a longitudinal axis 49, forming an oblique angle with respect to planes 43, 44, 47 and 48.

Flexing portion 40 includes recessions 50, 51, 52 and 53, arranged in pairs. Recessions 50 and 52 are disposed on opposing sides of flexing portion 40 and are in superimposition. Recessions 51 and 53 are disposed on opposing sides of flexing portion 40 and are in superimposition. Recessions 50 and 51 are present on a common side of flexing portion 40 and are spaced-apart along longitudinal axis 49. Recessions 52 and 53 are present on a common side of flexing portion 40 and are spaced-apart along longitudinal axis 49. The pair of recessions 50 and 52 defines a first joint of flexing portion 40, and recessions 51 and 53 define a second joint of flexing portion 40. With both flexures 34 four joints 60, 61, 62 and 63 are provided between chuck 30 and platform 12, with a first pair 60 and 61 of joints being disposed on a side of chuck 30 that is opposite to the side of chuck 30 upon which pair 62 and 63 of joints are disposed. With this configuration, movement of chuck in directions other than the Z direction are constrained, with flexure 34 operating as a resilient member in response to movement of chuck 30 along the Z direction.

Chuck 30 includes a surface 75 surrounded by a rim 76 that projects upwardly from a periphery of chuck 30 away from surface 75 so as to have a surface 77 spaced-apart from surface 75 and lying in a plane 78. Rim 76 is approximately 1 millimeter wide measured in a direction orthogonal to the Z direction. A plurality of reference pins 79 extend from surface 75, terminating in plane P. Surface 75 surrounds a recess 80 having a periphery 78. Surface 75 is approximately 15 millimeters wide, measured in a direction that is orthogonal to the Z direction, i.e., as measured between periphery 78 and rim 76. Reference pins 79 are spaced-equidistant from adjacent reference pins 79. Reference pins 79 have a square cross-section with an area of approximately 0.25 millimeter square and a height, measured along the Z direction that is equal to height of rim 76, approximately 0.3 millimeter. A center-to-center spacing between adjacent reference pins 79 is approximately 1.8 millimeters. Reference pins 79 disposed closest to, e.g., adjacent to, rim 76 are spaced-apart therefrom approximately 1 millimeter. Reference pins 79 disposed closest to, e.g., adjacent to, periphery 78 are spaced-apart therefrom approximately 0.5 millimeter.

A plurality of piezo pins 81 is disposed within recess 80. In an exemplary embodiment, 25 to 36 piezo pins 81 are present and spaced-apart equally over a 25 mm×25 mm field area. Specifically, a boundary of the 25 mm×25 mm field bisects piezo pins 81 located adjacent to periphery 78, i.e., piezo pins 80 located closest to periphery 78. Spacing between the reference pin 79 and piezo pin 81 closest thereto is approximately 2 millimeters. Center-to-center spacing of adjacent piezo pins 81 is approximately 4 millimeters.

Piezo pins 81 are attached to one or more actuators 82. Piezo actuators 82 are selected to operate when the 25 mm×25 mm field area is subjected to a load of approximately 100 Newtons and provide piezo pins 81 with 9 micrometers movement. Piezo pins 81 are designed to have a maximum strain value of 0.15%, a length of approximately 6 millimeters and a square cross-sectional area of 3 square millimeters. As a result, piezo pins 81 are formed from a ceramic material. The error due to the application of the load L on pins of unequal lengths is limited to 3 nanometers in the present example so as to satisfy the following relation:

$$L \, dl/E \, A \leq 3 \text{ nm} \qquad (1)$$

where E is the Young's modulus of the piezo pins 81, A is the cross-sectional area of the same and dl is the difference between the length of the short piezo pin 81 compared with the longest piezo pin 81. The maximum value of dl is 5 micrometers that provides r≧0.5 millimeter. It was determined that a desired stiffness for piezo pins 81 would be no less than approximately $32.986 \times 10^6$ N/m. Piezo pins 81, of the present example, were found to have a desired stiffness of approximately $100 \times 10^6$ N/m. Each piezo pins 81 are capped with stainless steel hemispherical-shaped caps 83. Caps 83 are attached to piezo pins 81 using non-conductive epoxy. Caps 83, as well as reference pins 79, are planarized so that the variation in height over the total area defined by the upper surfaces of piezo pins 81 and reference pins 79 varies no greater than 100 nm. To minimize creep, hysteresis and static drift in piezo actuators 82, capacitive sensors or strain gauge sensors may be provided in a closed loop control configuration. Exemplary actuators employed in the present invention are available under part number CMAP3 from Adaptronics, Inc. of Troy, N.Y. A 25 channel controller 84 sold under part number LA-75A from Adaptronics, Inc. is in signal communication with actuators 82 to control operation of the same.

Figure 5:
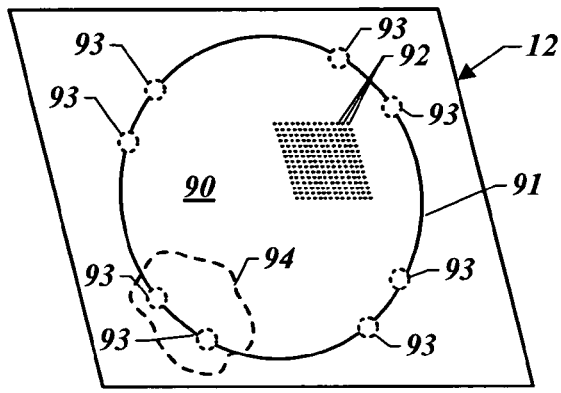
FIG. 5 is a perspective view of a support shown in FIG. 1, in accordance with the present invention.

Referring to FIG. 5, support 14 is a plate of stainless steel that is approximately 0.5 millimeter thick and 250 millimeters square. A surface 90 of support 14 is surrounded by a rim 91, extending therefrom to define a circular region. The circular region is covered with pins 92. Pins 92 have a diameter of 0.5 millimeter, measured orthogonally to the Z direction, a height of 0.3 millimeter, measured along the Z direction. Pin-to-pin spacing is approximately 2 millimeters, measured along the X and Y directions. A plurality of vacuum seals 93 is provided at a periphery of region 90. The flexural rigidity of support 14 is designed to match the structural rigidity of wafer 16.

Figure 6:
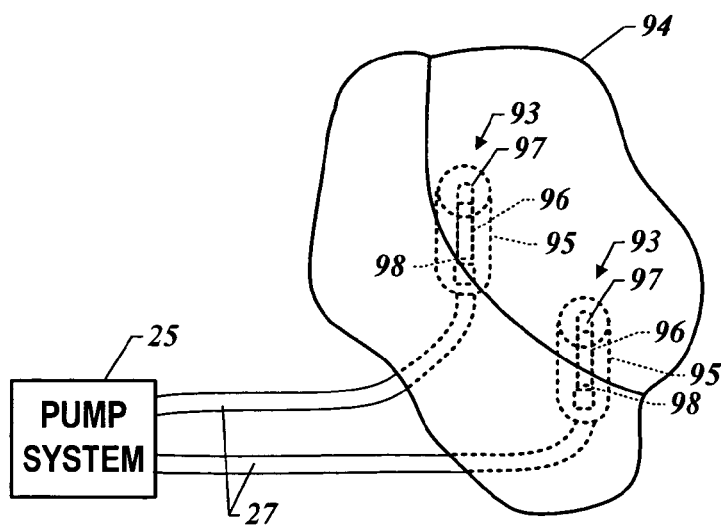
FIG. 6 is a detailed plan view of the support shown in FIG. 5.
Figure 7:
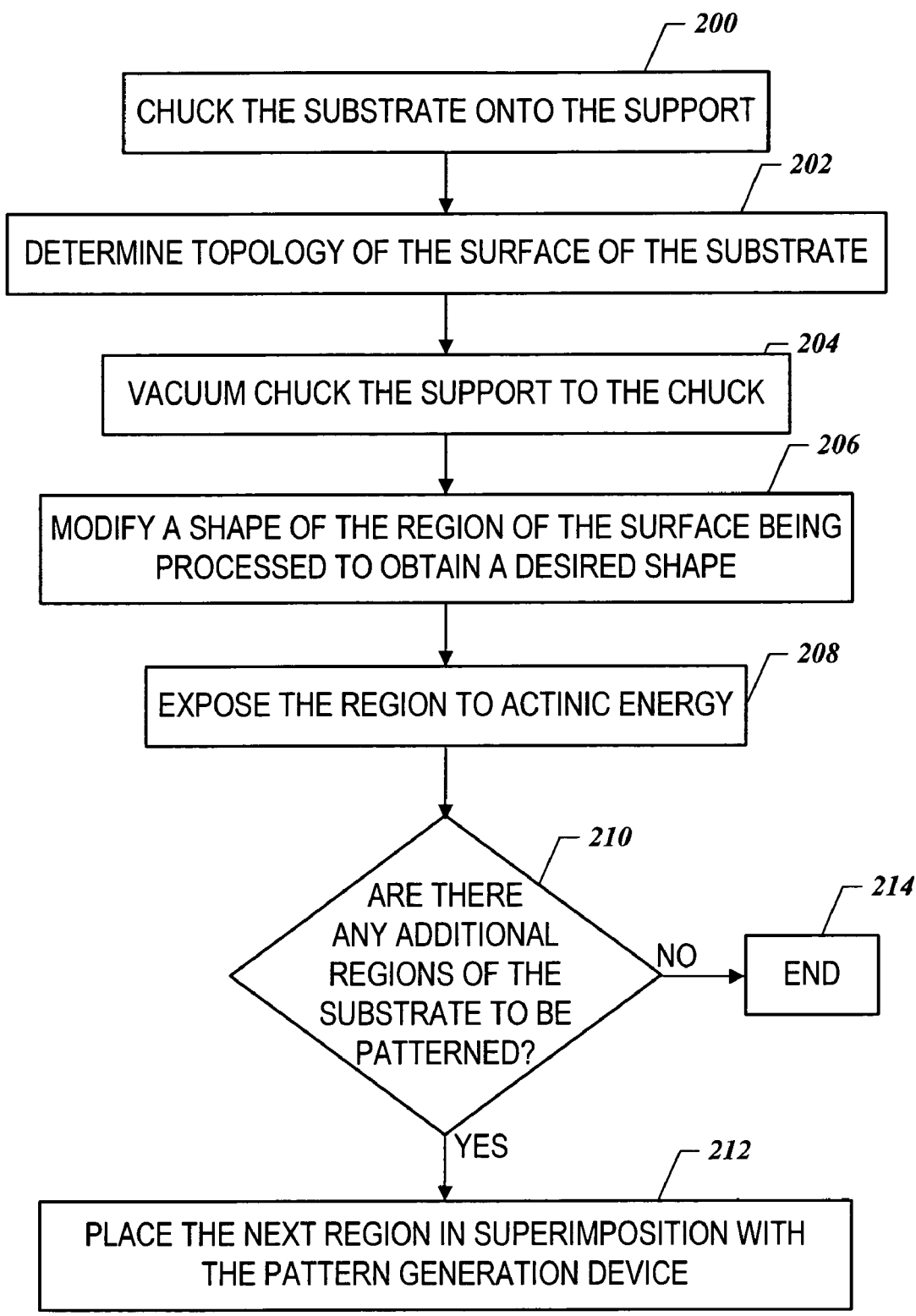
FIG. 7 is a flow diagram showing a method of implementing the present invention.

Referring to both FIGS. 5 and 6, each vacuum seal 93 includes a stand-off 95 having a throughway 96 extending from an aperture 97 formed in region 90 and terminating in an opening 98 in stand-off 95, disposed opposite to aperture 97. Stand-off 95 may be 8 millimeters or longer. Each of vacuum seals 93 are placed in fluid communication with a pump system 25 through conduits 27 to control the velocity and direction of fluid flow through apertures 97. As a result, apertures 97 are arranged in region 90 so that substrate 16 rests thereon and may be vacuum chucked to support 14. The advantages of support 14 are manifold. For example, it is believed that by resting substrate 16 on support 14, substrate 16 rests against a surface similar to a conventional pin type chuck despite the presence of pizeo pins 81. In other words, support 14 allows center-to-center spacing of pins in contact with substrate 16 to be independent of the center-to-center spacing of pins of chuck 30. This is particularly advantageous in light of the arrangement and size of piezo pins 81. As a result, the point contact effectuated by piezo pins 81 results in variations to substrate 16 that are smooth and continuous. This facilitates sub-100 nanometer variations in substrate 16 surface topology while minimizing the number of piezo pins 81 required for the same. Additionally, support 14, being fabricated from stainless steel, avoids particulate generation that might occur were pins 18 to contact substrate 16 directly. Support 14 may also be formed from numerous other materials, such as silicon, fused silica, silicon carbide and the like.

In operation, substrate 16 is chucked onto support 14 at step 200 by application of vacuum through throughways 97. At step 202 a surface of substrate 16 facing away from support 14 is analyzed using standard techniques to determine topography of the same that is stored in memory 35, i.e., mapped into memory 35 as an interpolative function of the topography. For example, laser interferometry may be employed to determine a shape of the requisite surface of substrate 16. At step 204 support 14, with substrate 16 attached thereto, is chucked to chuck 30 by applying vacuum to recess 80 vis-a-vis throughway 99 that is in fluid communication with pump system 25. In this manner, support 14 is chucked onto chuck 30 by forming a seal against rim 76 and application of a vacuum by pump system 25 in fluid communication with chuck 30 through lines 101. As a result, support 14 rests against rim 76 and reference pins 79. It is desired that chuck 30 pre-stress piezo pins 81 to increase the operational life of piezo actuators 82, e.g., place actuators 82 in a state compression. To that end, rim 76 forms a seal with support 14 thereon to define a chamber between surface 75 and support 14. Specifically, evacuation of recess 80 holds support 14 firmly against rim 76, with substrate 16 being held firmly against rim 91. As a result, substrate 16 is fixedly attached to chuck 30.

When substrate 16 is fixedly attached to chuck 30, vis-a-vis support 12, a profile of a surface of substrate 16, facing away from chuck 30, is modified at step 206. Specifically, a sub-portion of the information concerning the topology of substrate 16 stored in memory 35 is analyzed by processor 33. This sub-portion of information corresponds to the profile of the surface that is in superimposition with the 25 mm×25 mm field, in which piezo pins 81 lie. Processor 33, operating on this information and a routine stored therein, generates control signals that are sent to controller 84. The algorithms included in the routine and stored in memory 35 to modify the profile of the surface of substrate 16 are discussed more fully below. In response to the a control signals, controller 84 causes piezo pins 81 to move and provide the surface of substrate 16 with a desired profile. Specifically, actuators 82 receive signals from controller 84 to vary a height of piezo pins 82, measured with respect to reference pins 79, to minimize any non-planarity measured in the profile of the surface of the processing region. Actuators 82 generate movement of piezo pins 81 causing deformation of support 14 in a portion thereof in superimposition with the 25 mm×25 mm field. In this manner, the situs and magnitude of one or more point contacts are made by piezo pins 81 to provide the region of surface of substrate 16 that is to be patterned to have variations in height no greater than 100 nanometers. After obtaining the desired profile of the surface, at step 208 a region is exposed to actinic energy in furtherance of patterning the same in accordance with the patterning technology employed, e.g., photolithography or imprint lithography. After exposing the region to actinic energy, at step 210 it is determined whether there remain any additional regions of substrate 16 to be exposed to actinic energy. If not, the method ends at step 212 and if so, the process continues at step 214 wherein the next region, substrate 16, is placed in superimposition with patterning device 26. The process continues at step 206.

With the present invention, chuck 30 can be positioned underneath every field of substrate 16 including end fields and hence provides for end-field correction. A distinguishing feature of the adaptive shape substrate chuck is its step and repeat mode of substrate flatness error correction. Support 14 provides support to substrate 16 and provides a smooth compensation profile driven by actuators 82. By movement of substrate 16 by X-Y stage 18, actuators 82 may be selectively positioned in superimposition with regions of substrate 16 being patterned. Thus it follows a step and repeat mode of correction. This arrangement helps to minimize the number of actuators to 25 or 36 and, at the same time, provides better than 100 nm flatness accuracy.

To determine the profile of the surface of substrate 16, data from several different regions of the surface containing profile information are obtained, which is referred to as datum points. The datum points are chosen to lie on the surface of processing region, and the totality of the datum points is representative of the topography of that surface. In the present example, 32 datum points are obtained. For every 6.25 millimeters of movement along the X-direction, there is a datum point representing every ⅛th of a field in the Y-direction and vice versa. It is believed that this arrangement provides an accurate representation of the surface of processing region with a minimum number of datum points. Information contained in the datum points is operated on by processor 33 to generate control signals to actuators 82 to compensate for non-planarity present in the surface. Specifically, flatness deviation over the area of the processing region is determined by comparison with the information contained in the datum points with respect to a reference point, referred to as PNT0. In response to the signals, actuators 82 move piezo pins 81 so as to minimize the non-planarity in the surface. To that end, one of several control algorithms may be employed and stored in memory as computer readable code, with PNT0 being considered the origin of reference in the control algorithms.

For example, a direct compensation algorithm may be employed in which flatness deviation is measured at a situs on the surface of the processing region that is in superimposition with one of the piezo pins 81. In this fashion, the number of datum points would be commensurate with the number of piezo pins 82 present in chuck 30 so that each datum point would contain information concerning the surface that is in superimposition with one of the piezo pins 81. A benefit of this algorithm is that it is believed to minimize the computational burden necessary to obtain desired control signals.

Alternatively, surface fitting algorithms may be employed. One such algorithm is known as an algebraic surface fitting (ASF) algorithm. The ASF algorithm determines flatness deviations at the datum points, as well as the complementary values to the same. In one example of the ASF algorithmic implementation, the surface of the processing region is represented by a 4th order polynomial equation as follows:

$$Z(x, y) = A_0 + A_1 x + A_2 y + A_3 x^2 + A_4 xy + A_5 y^2 + A_6 x^3 + A_7 x^2 y + A_8 xy^2 + A_9 y^3 + A_{10} x^4 + A_{11} x^3 y + A_{12} x^2 y^2 + A_{13} xy^3 + A_{14} y^4 \quad (2)$$

The coefficients $A_i$ are determined using x, y and z values known such as, 15 datum points. Upon determining Z(x,y), actuators 82 move piezo pins 81 so that caps 83 allow the surface opposite to the surface being contacted by caps 83 lie on the surface defined Z(x,y). To improve the representation the surface of processing region by equation (2), root mean square (RMS) error values may be determined for the datum points and equation (2) may be modified to compensate for these RMS error values.

Another surface fitting algorithm is known as a B-spline surface fit. B-spline surfaces have the following properties: (i) continuity of the surface in each parametric direction is two less than the number of defining polygon vertices in that direction; and (ii) the surface is smooth and lies within the convex hull of the defining polygon net. The B-spline surface fit may be defined as follows:

$$Q(u, w) = \sum_{i=1}^{n+1} \sum_{j=1}^{m+1} B_{i,j} N_{i,k}(u) M_{j,l}(w) \quad (3)$$

where $N_{i,k}(u)$ and $M_{j,l}(w)$ are the B-spline basis functions in the bi parametric u and w directions, respectively. The basis function $N_{i,k}(u)$ is defined as follows:

$$N_{i,1}(u) = \begin{cases} 1 & \text{if } x_i \leq u < x_{i+1} \\ 0 & \text{otherwise} \end{cases} \quad (4)$$

$$N_{i,k}(u) = \frac{(u - x_i) N_{i,k-1}(u)}{x_{i+k-1} - x_i} + \frac{(x_{i+k} - u) N_{i+1,k-1}(u)}{x_{i+k} - x_{i+1}}$$

and the basis function $M_{j,l}(w)$ is defined as follows:

$$M_{j,1}(w) = \begin{cases} 1 & \text{if } y_j \leq w < y_{j+1} \\ 0 & \text{otherwise} \end{cases} \quad (5)$$

$$M_{j,l}(w) = \frac{(w - y_j) M_{j,l-1}(w)}{y_{j+l-1} - y_j} + \frac{(y_{j+l} - w) M_{j+1,l-1}(w)}{y_{j+l} - y_{j+1}}$$

where $x_i$ and $y_j$ are elements of knot vectors[ ]. $B_{i,j}$ are the vertices of a defining polygon net.

Given a known set of data on a surface, the defining polygon net for a B-spline surface that best interpolates the data may be determined. For example, the basis functions $N_{i,k}(u)$ and $M_{j,l}(w)$ may be determined for a known order and a known number of defining polygon net vertices provided that the values of u,w are known at the surface data points. Each known surface data point provides a linear equation in the unknown defining net vertices $B_{i,j}$ as shown as follows:

$$D_{1,1}(u_1, w_1) = \quad (6)$$
$$N_{1,k}(u_1)[M_{1,l}(w_1)B_{1,1} + M_{2,l}(w_1)B_{1,2} + \ldots + M_{m+1,l}(w_1)B_{1,m+1}] +$$
$$N_{n+1,k}(u_1)$$
$$[M_{1,l}(w_1)B_{n+1,1} + M_{2,l}(w_1)B_{n+1,2} + \ldots + M_{m+1,l}(w_1)B_{n+1,m+1}]$$

where r×s is a topologically rectangular set of data $2 \leq k \leq n+1 \leq r$ and $2 \leq l \leq m+1 \leq s$. In matrix form equation (6) may be expressed as follows:

$$[D] = [C][B] \quad (7)$$

where $C_{i,j} = N_{i,k} M_{j,l}$. From equation (7), the defining polygon net is obtained as follows:

$$[B] = [C]^T [C]]^{-1} [C]^T [D] \quad (8)$$

Once the matrix B is obtained, the values of Q on a conjugate surface at piezo pins 81 are obtained using equation (3). Actuators 82 are operated accordingly in order to locate piezo pins 81 on the B-spline surface.

Another algorithm that may be employed to produce control signals for actuators 82 is referred to as a linear superimposable algorithm (LSA). The LSA is based upon the linear superposition of the movement caused by individual actuators 82. Specifically, the relationship between the changes in position of the datum points to individual actuators 82 is scalable and additive. In the present example, the change in position of the datum points due to 1 millimeter of movement of piezo pins 81 in response to activation of actuators 82 is determined for a typical substrate 16 thickness of 0.5 mm when positioned on chuck 30. The change in positions of datum point are referred to as the "mode shapes". In this fashion, the LSA expresses the conjugate profile of the processing surface as mode shapes. The movements of the datum points are linear superimposable, because actuators 82 with non-zero actuation are in contact with support 14. As a result, the surface correction reduces to an optimization problem with displacements of piezo pins 81 as the variables, constraints on piezo pins 81 movement to take into account that the same is in contact with support 14, that the movement is within the motion range (<9 mm), and to account for the resolution of the actuators (1 nm).

The present invention provides all the salient aspects of reduced area associated with a pin type chuck, as support 14 functions the same. As a result, the present invention may be incorporated as a stand-alone substrate holding device to support and planarize a substrate. Alternatively, the present invention may be retrofitted onto existing chucking systems to improve the operational performance of the same. One of the benefits realized by the present invention is improved planarity of substrates to better than 100 nm through the use of piezoelectric actuators with nanometer resolution. Additionally, the flatness control may be independent of the source of the substrate flatness error, e.g., backside particles or local thickness variations. Additionally the present invention also facilitates compensation for substrate edge effects.

The embodiments of the present invention described above are exemplary. Many changes and modifications may be made to the disclosure recited above, while remaining within the scope of the invention. Rather, the present invention may be employed to control the planarity of a substrate during any processing in addition to patterning, such as, chemical mechanical polishing/planarization. The invention may be employed outside of semiconductor substrate processing. For example, the invention may be employed to control the planarity of any suitable substrate, such as fused lenses made from silicon, fused silica, carbon and the like. The scope of the invention should, therefore, not be limited by the above description, but instead should be determined with reference to the appended claims along with their full scope of equivalents.

What is claimed is:

1. A support system for a substrate, said support system comprising:
   a chuck having a plurality of piezo pins and reference pins, with said piezo pins being coupled to piezo actuators to undergo relative movement with respect to said reference pins; and
   a support resting upon said reference with a region of said support being in superimposition with said piezo pins.

2. The support system as recited in claim 1 further including a vacuum system in fluid communication with said chuck to selectively vacuum chuck said support to said chuck.

3. The support system as recited in claim 1 further including a stage system to facilitate movement along two orthogonal directions with said piezo actuators coupled to facilitate movement of said piezo pins along an additional direction, orthogonal to said two orthogonal directions.

4. The support system as recited in claim 3 further including a flexure system, with said chuck being coupled to said stage system through said flexure system, with said flexure system constraining movement of said chuck along said additional direction.

5. The support system as recited in claim 1 further including a processor and a memory in data communication with said processor, with said processor being in data communications with said actuators to generate control signals therefor.

* * * * *